(12) United States Patent
Jun et al.

(10) Patent No.: US 9,024,511 B2
(45) Date of Patent: May 5, 2015

(54) IMPACT-TYPE PIEZOELECTRIC MICRO POWER GENERATOR

(71) Applicant: Electronics and Telecommunications Research Institute, Daejeon (KR)

(72) Inventors: Chi Hoon Jun, Daejeon (KR); Sang Choon Ko, Daejeon (KR); Seok-Hwan Moon, Daejeon (KR); Kwang-Seong Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 219 days.

(21) Appl. No.: 13/864,341

(22) Filed: Apr. 17, 2013

(65) Prior Publication Data

US 2014/0159547 A1 Jun. 12, 2014

(30) Foreign Application Priority Data

Dec. 6, 2012 (KR) ........................ 10-2012-0141031

(51) Int. Cl.
*H01L 41/09* (2006.01)
*H01L 41/113* (2006.01)

(52) U.S. Cl.
CPC .................................. *H01L 41/1136* (2013.01)

(58) Field of Classification Search
CPC ............ H01L 41/1136; H01L 41/0926; H01L 41/0933; H01L 41/0934; H01L 41/096
USPC ......................................................... 310/339
See application file for complete search history.

(56) References Cited

U.S. PATENT DOCUMENTS

| 6,954,025 | B2 | 10/2005 | Nishida et al. | |
| 7,260,984 | B2 | 8/2007 | Roundy et al. | |
| 2013/0082569 | A1* | 4/2013 | Hirabayashi et al. | 310/319 |
| 2013/0293069 | A1* | 11/2013 | Sakaguchi et al. | 310/348 |
| 2013/0328446 | A1* | 12/2013 | Horiguchi et al. | 310/329 |

OTHER PUBLICATIONS

Marco Ferrari et al., "Piezoelectric multifrequency energy converter for power harvesting in autonomous microsystems", Sensors and Actuators A, Mar. 10, 2008, pp. 329-335, vol. 142, Issue 1.

* cited by examiner

*Primary Examiner* — Thomas Dougherty
(74) *Attorney, Agent, or Firm* — Rabin & Berdo, P.C.

(57) ABSTRACT

The present inventive concept discloses an impact-type piezoelectric micro power generator. The impact-type piezoelectric micro power generator may comprise a base having a cavity and at least one stop area adjacent to the cavity; a frame fastened to the base; a vibrating body comprising a plurality of first vibrating beams extended from the frame toward a top of the cavity, an impact beam connected to between first tips of the plurality of first vibrating beams and extended onto the stop area, and a second vibrating beam extended from the impact beam to between the plurality of first vibrating beams, the second vibrating beam having a second tip; and a piezoelectric device disposed on one of a top and a bottom of the second vibrating beam and the impact beam, the piezoelectric device generating electric power according to impacts of the vibrating body to the stop area and bending of the impact beam and the second vibrating beam.

16 Claims, 8 Drawing Sheets

IMPACT-TYPE PIEZOELECTRIC MICRO POWER GENERATOR

CROSS-REFERENCE TO RELATED APPLICATIONS

This U.S. non-provisional patent application claims priority under 35 U.S.C. §119 of Korean Patent Application No. 10-2012-0141031, filed on Dec. 6, 2012, the entire contents of which are hereby incorporated by reference.

BACKGROUND OF THE INVENTION

The present inventive concept disclosed herein relates to a piezoelectric power generator generating power by itself, and more particularly, to an impact-type piezoelectric micro power generator.

Portable electronic devices generally used in daily lives or production environments may include a battery or a fixed power supply as a power source. Particularly, in the case of batteries, it is necessary to periodically charge or exchange according to lifespan thereof. Maintenance cost occurs when changing batteries, and environmental pollution is generated when disposing them. Accordingly, recently, instead of power sources including batteries or fixed power supplies, necessity of self-powered electronic devices generating power by itself and operating has been increased. Particularly, as sensing and monitoring devices have been developed to be wireless and to consume low power, it is necessary to develop micro power generators capable of supplying power by using an energy harvesting principle collecting or harvesting electric energy from surrounding environments. These may have a modular form or a single body shape and may be used for electronic devices function as independent power sources or emergency power sources.

Micro power generation using energy harvesting may have great technical and economical effects when being used in places in which environmental energy always exist, for example, vehicles, motors, railways, flights, roads, bridges, air conditioning systems, and automated production lines. For example, a tire pressure monitoring system (TPMS) that is a wireless sensor module monitoring a pneumatic tire pressure state in real time may be installed together with a micro power generator. In this case, the micro power generator converts mechanical energy generated in the tire into electric energy to provide power to the wireless sensor module for the vehicle without using an external power supply unit.

Piezoelectric micro power generators may convert physical energies such as vibrations, impacts, rotational forces, inertial forces, pressure, and fluid flows into electric energies. Mostly, as energy converting materials of piezoelectric micro power generators, piezoelectric materials are used. Piezoelectric materials may generate electrical charges when mechanical strain applied to the piezoelectric body. Accordingly, electrical charges are collected by using electrodes, thereby generating electric energies.

SUMMARY OF THE INVENTION

The present invention provides an impact-type piezoelectric micro power generator having a simple configuration, generating electric energy with high efficiency, and having high reliability.

Embodiments of the inventive concept provide an impact-type piezoelectric micro power generator comprising a base having a cavity and at least one stop area adjacent to the cavity; a frame fastened to the base; a vibrating body comprising a plurality of first vibrating beams extended from the frame toward a top of the cavity, an impact beam connected to between first tips of the plurality of first vibrating beams and extended onto the stop area, and a second vibrating beam extended from the impact beam to between the plurality of first vibrating beams, the second vibrating beam having a second tip; and a piezoelectric device disposed on one of a top and a bottom of the second vibrating beam and the impact beam, the piezoelectric device generating electric power according to impacts of the vibrating body to the stop area and bending of the impact beam and the second vibrating beam.

In some embodiments, the frame may have a shape of one of a loop and a ring surrounding the cavity of the base.

In other embodiments, the stop area of the base may be disposed in the frame having the shape of one of the loop and the ring.

In still other embodiments, the stop area may be overlapped with both ends of the impact beam of the vibrating body and disposed below the impact beam.

In even other embodiments, the stop area may be disposed below one of the plurality of first vibrating beams and the impact beam.

In yet other embodiments, the stop area may be disposed to traverse the cavity.

In further embodiments, the piezoelectric device may be disposed on one of a top and a bottom of a part of the second vibrating beam and generates electric power according to bending of the second vibrating beam.

In still further embodiments, the piezoelectric device may be disposed on one of a top and a bottom of a part of the impact beam and generates electric power according to bending of the impact beam.

In even further embodiments, the piezoelectric device may include one of a piezoelectric unimorph, a piezoelectric bimorph, and a piezoelectric multimorph.

In yet further embodiments, the piezoelectric unimorph may include a lower electrode disposed on one of the second vibrating beam and the impact beam, a piezoelectric body disposed on the lower electrode, and an upper electrode disposed on the piezoelectric body.

In much further embodiments, the piezoelectric body may include at least one of an inorganic material, an organic material, and a mixture thereof.

In still much further embodiments, the impact-type piezoelectric micro power generator may further include at least one wiring electrically connected to one of the upper electrode and the lower electrode of the piezoelectric device and the frame, and at least one pad electrically connected to the wiring and disposed on the base.

In even much further embodiments, the lower electrode may be fastened to the vibrating body by using one of an adhesive and a deposited film.

In yet much further embodiments, the adhesive may include one of conductive epoxy and insulating epoxy.

In yet much further embodiments, the impact-type piezoelectric micro power generator may further include a mass adjacent to the piezoelectric device and fastened to the second tip of the second vibrating beam to control a frequency response of the vibrating body.

In yet much further embodiments, the impact-type piezoelectric micro power generator may further include a lid covering the vibrating body to restrict a moving distance of the vibrating body above the base or protect the vibrating body.

BRIEF DESCRIPTION OF THE DRAWINGS

The accompanying drawings are included to provide a further understanding of the inventive concept, and are incordrawings illustrate exemplary embodiments of the inventive concept and, together with the description, serve to explain principles of the inventive concept. In the drawings.

DETAILED DESCRIPTION OF PREFERRED EMBODIMENTS

Figure 1A:
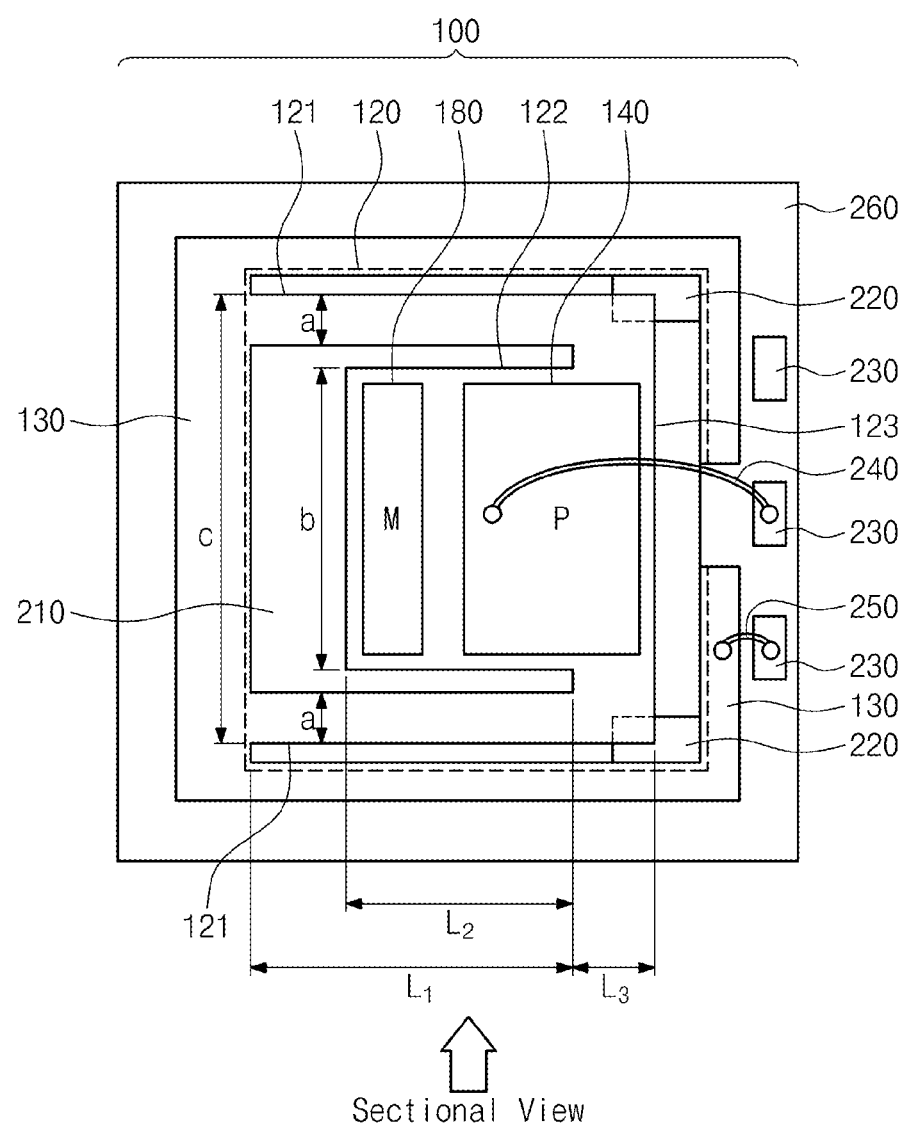
FIG. 1A is a top view illustrating an impact-type piezoelectric micro power generator according to an embodiment of the inventive concept.

Preferred embodiments of the inventive concept will be described below in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

Also, in the drawings, for clear description, a part having no connection with the description, like reference numerals designate like elements throughout.

Throughout the description and the whole claims, when a part "includes/comprises" an element, with no particularly contrary mention, this means that the part may further include/comprise another element, which does not mean an exclusion of other elements.

When a part such as a layer, an area, a plate, etc is "on" another part, this means not only being right on the other part but interposing still another part therebetween. On the contrary, when a part is "right on" another element, this means that there is no other part therebetween.

Figure 1B:
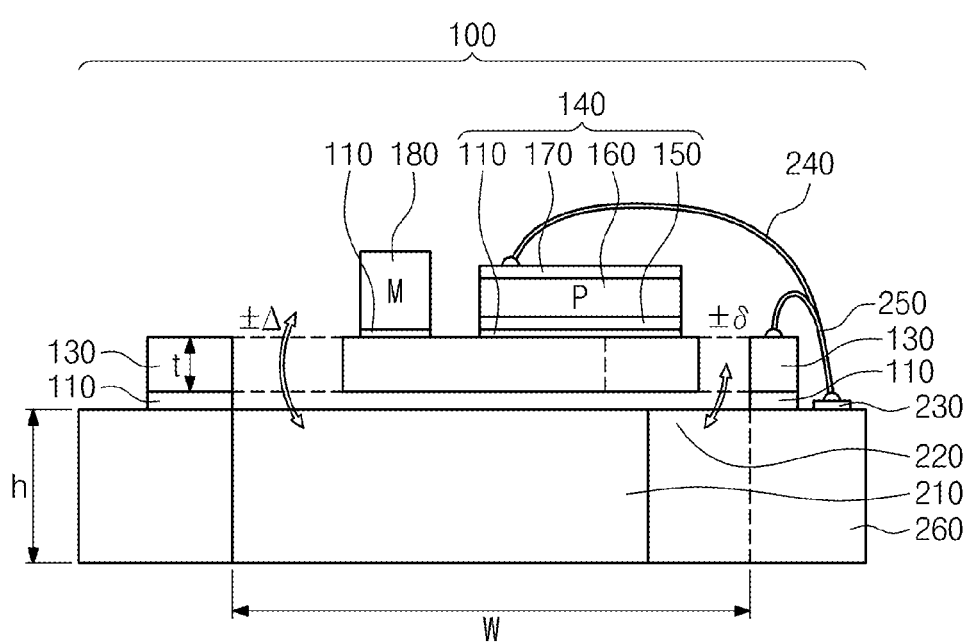
FIG. 1B is a cross-sectional view illustrating the impact-type piezoelectric micro power generator of FIG. 1A.

FIG. 1A is a top view illustrating an impact-type piezoelectric micro power generator 100 according to an embodiment of the inventive concept, and FIG. 1B is a cross-sectional view illustrating the impact-type piezoelectric micro power generator 100 of FIG. 1A.

Referring to FIGS. 1A and 1B, the impact-type piezoelectric micro power generator 100 may comprise a vibrating body 120, a piezoelectric device 140, a mass 180, a frame 130, and a base 260.

The vibrating body 120 may respond to an outer environment and may generate a mechanical movement. The vibrating body 120 may comprise a plurality of first vibrating beams 121 extended from the frame toward a top of the cavity 210, an impact beam 123 connected to between first tips of the plurality of first vibrating beams 121 and extended onto a stop area 220, and a second vibrating beam 122 extended from the impact beam 123 to between the plurality of first vibrating beams 121. The plurality of first vibrating beams 121 may have a first length $L_1$ and a first width a. The second vibrating beam 122 may have a second length $L_2$ and a second width b. The first length $L_1$ is greater than the second length $L_2$. The impact beam 123 may have a third length $L_3$ and a third width c. The first vibrating beams 121, the impact beam 123, and the second vibrating beam 122 may be connected in a folded shape. When the second vibrating beam 122 moves, the first vibrating beams 121 and the impact beam 123 may move while being connected with one another. The first vibrating beams 121, the impact beam 123, and the second vibrating beam 122 in the folded shape may provide an effect of increasing the entire length thereof in a small area. Accordingly, the vibrating body 120 may respond to an external low vibration frequency. A response to vibration frequency may be precisely controlled by adjusting the first to third lengths $L_1$, $L_2$, and $L_3$, the first to third ling widths a, b, and c, and a thickness t.

The vibrating body 120 and the frame 130 are formed of at least one of an inorganic material, an organic material, and a compound thereof such as FR4, FR5, polyimide, PET, polydimethylsiloxane (PDMS), ceramic, glass, metal, a metal alloy, plastic, and silicon. The vibrating body 120 and the frame 130 may have a thickness t of from about 10 to about 1,000 μm.

The piezoelectric device 140 may comprise one of a piezoelectric unimorph, a piezoelectric bimorph, and a piezoelectric multimorph disposed above or below the second vibrating beam 122 and the impact beam 123. The piezoelectric device 140 of the piezoelectric unimorph may comprise a lower electrode 150, a piezoelectric body 160 on the lower electrode 150, and an upper electrode 170 on the piezoelectric body 160. The piezoelectric multimorph may be disposed not only above the vibrating body 120 but below the vibrating body 120. The lower electrode 150 and the vibrating body 120 may be connected by an adhesive 110 or a deposited film. The adhesive 110 may comprise one of conductive epoxy and insulating epoxy. The lower electrode 150 may be electrically connected to the frame 130 due to being in contact with the vibrating body 120. The lower electrode 150 and the upper electrode 170 may comprise metal such as Ni, Ag, Al, Au, etc. The lower electrode 150 and the upper electrode 170 may have a thicknesses of from about 0.3 to about 10 μm.

The piezoelectric body 160 may convert a mechanical variation of the vibrating body 120 into electric energy. The piezoelectric body 160 may comprise ceramic such as PZT, PZN-PT, PMN-PT, PMN-PZT, $BaTiO_3$, and $PbTiO_3$, a metal nitride such as AlN, a metal oxide such as ZnO, an organic material such as PVDF, and a nano material such as a nano wire, and a nano tube. The piezoelectric body 160 may have a thickness of from about 1 to about 500 μm.

The mass 180 may be disposed on a second tip that is a terminal of the second vibrating beam 122 adjacent to the piezoelectric body 160. The second vibrating beam 122 and the mass 180 may be fastened by using one of the adhesive 110 and a deposited film. The mass 180 may comprise a metal having high density, such as tungsten, and a compound thereof. Also, the mass 180 may comprise at least one of an inorganic material, an organic material, and a compound thereof.

The impact-type piezoelectric micro power generator 100 controls a frequency response thereof by using mass adjustment of the mass 180.

The base 260 may be formed of at least one of an inorganic material, an organic material, and a compound thereof such as FR4, FR5, polyimide, PET, polydimethylsiloxane (PDMS), ceramic, glass, metal, a metal alloy, plastic, and silicon. The base 260 and the frame 130 may be bonded to each other by using one of the adhesive 110 and a deposited film. The frame 130 may have one of a loop shape and a ring shape surrounding the cavity 210 of the base 260.

The vibrating body 120 may be fastened to the base 260 by the frame 130. The base 260 may have the cavity 210 and a stop area 220 adjacent to the cavity 210. The stop area 220 may be disposed below inside the frame 130.

A width W of the cavity 210 is greater than the sum of the first length $L_1$ of the first vibrating beams 121 and the third length $L_3$ of the impact beam 123. The cavity 210 may allow the vibrating body 120 to vibrate. A height h of the base 260 may limit a maximum displacement of the vibrating body 120.

One or more of the second vibrating beam 122 and the impact beam 123 of the vibrating body 120 may collide with the stop area 220 of the base 260. The stop area 220 may amplify a generation amount of electric energy by causing impact strain to the vibrating body 120. A basic mechanism thereof is that one of the second tip that is one end of the second vibrating beam 122 and the mass 180 bonded thereto may vertically vibrate with an amplitude of $\pm\Delta$. In this case, one of the impact beam 123 and a part of the second vibrating beam 122 on another end may be decreased in its vibration amplitude due to the stop area 220 and thus may vertically vibrate with the smaller amplitude of $\pm\delta$ than $\pm\Delta$. Accordingly, piezoelectric body 160 may generate high electric energy due to applied impact strain. That is, a vibration-induced impact is artificially caused on a part of the vibrating body 120 by using the stop area 220, thereby increasing a generation amount of electric energy.

Also, a part of the piezoelectric body 160 may be simply disposed adjacent to the stop area 220 by the medium of one of the impact beam 123 and the second vibrating beam 122 of the vibrating body 120, thereby forming a free-supported end structure. Accordingly, the piezoelectric body 160 may bear a severe operating condition such as a great mechanical shock and may stably output electric energy.

Pads 230 may be disposed on an edge of the base 260. The pads 230 may be connected to a wire 240 withdrawn from the upper electrode 170 of the piezoelectric device 140. The pads 230 may be electrically connected to the frame 130 with a wire 250 and the frame 130 may be electrically in contact with the lower electrode 150 of the piezoelectric device 140.

A lid (not shown) that is a cover limiting a moving distance of the vibrating body 120 or protecting vibrating body 120 may be additionally assembled to the base 260.

Figure 2A:
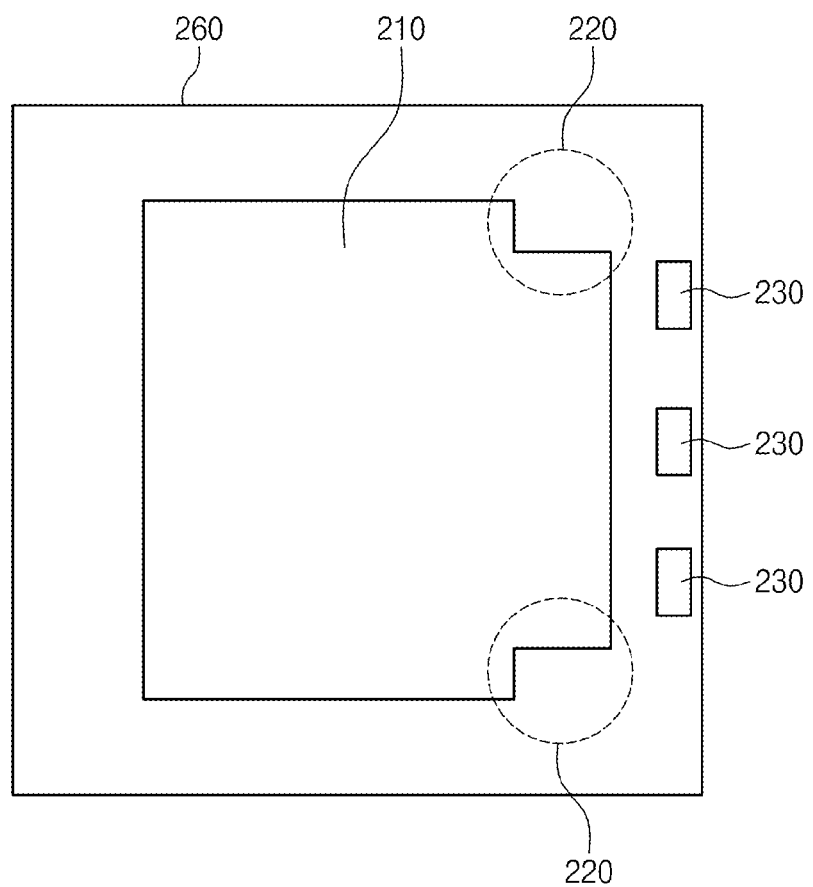
FIGS. 2A to 2C are top views illustrating examples of arranging a stop area on a base of FIGS. 1A and 1B.
Figure 2B:
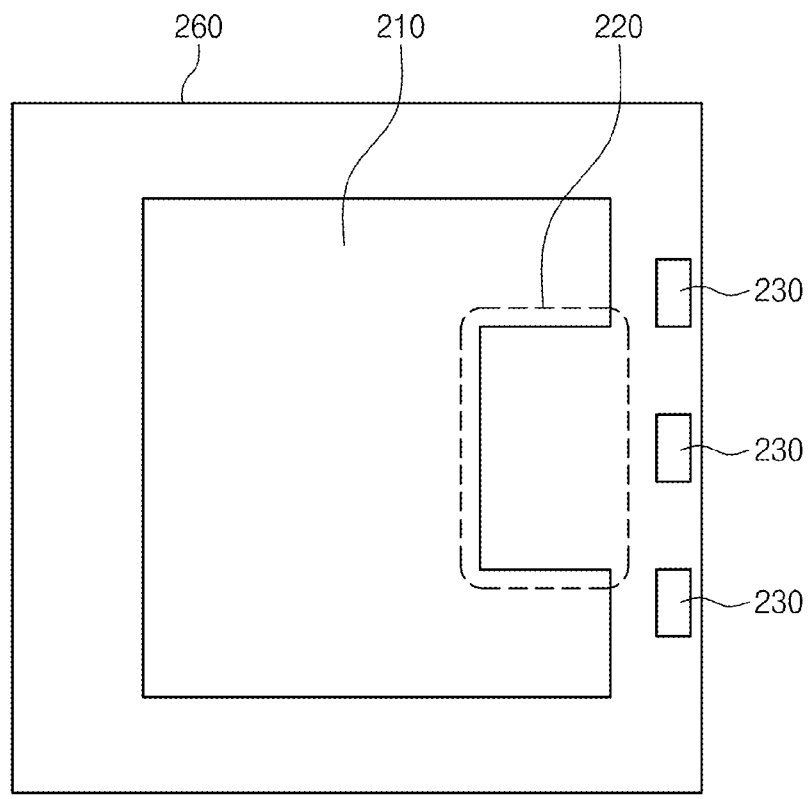
Figure 2C:
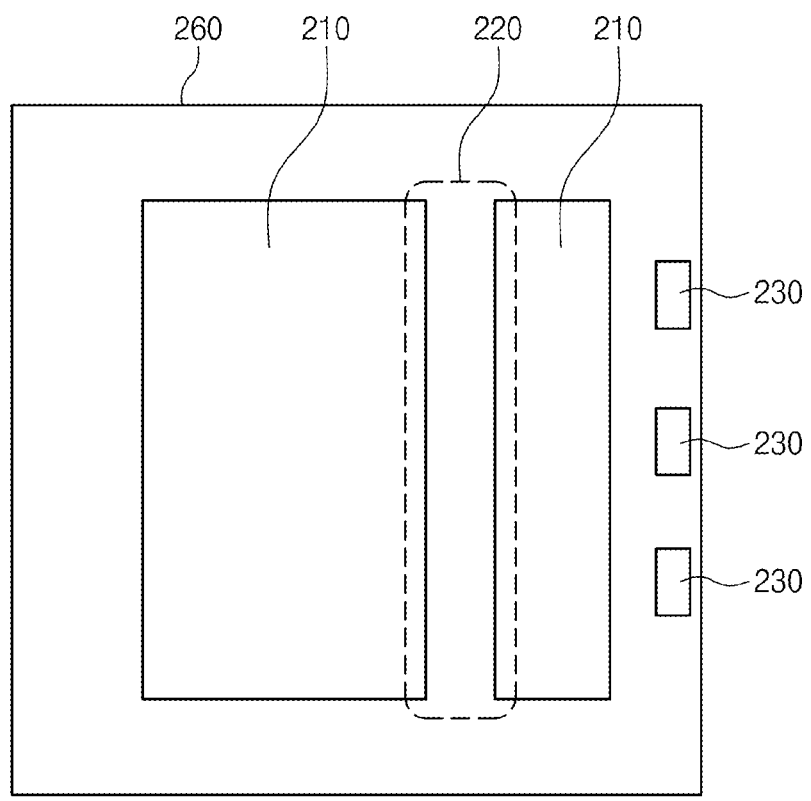

FIGS. 2A to 2C are top views illustrating examples of arranging the stop area 220 on the base 260.

Referring to FIGS. 1A and 2A, the stop area 220 may be overlapped with both terminals of the impact beam 123 of the vibrating body 120 and may be located below the impact beam 123. The stop area 220 may be disposed on edges of the cavity 210 of the base 260.

Referring to FIGS. 1A and 2B, the stop area 220 may be disposed below between the plurality of first vibrating beams 121 or the impact beam 123.

Referring to FIGS. 1A and 2C, the stop area 220 may be disposed to traverse the cavity 210. The stop area 220 is not limited to a certain shape and may be variously changed.

Figure 3:
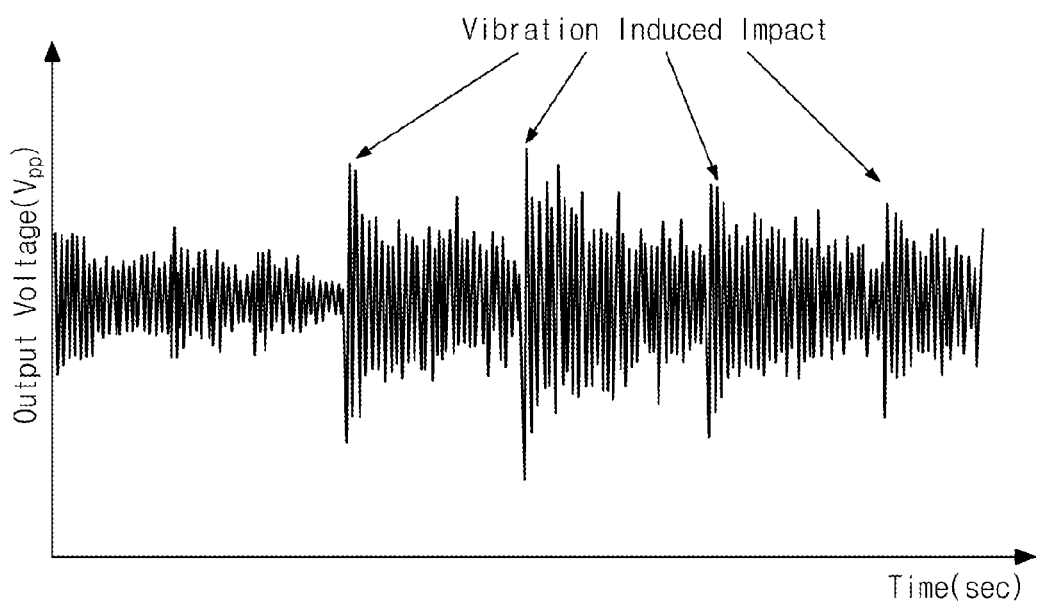
FIG. 3 is a graph illustrating a pattern of a waveform of an output voltage generated by the impact-type piezoelectric micro power generator of FIGS. 1A and 1B

FIG. 3 is a graph illustrating a pattern of a waveform of an output voltage generated by the impact-type piezoelectric micro power generator 100.

To mimic an external environment, a vibration having a sine waveform of 51.8 Hz in a Z-axis direction is artificially applied to the impact-type piezoelectric micro power generator 100 by using a vibration excitation system.

Referring to FIG. 3, the impact-type piezoelectric micro power generator 100 generates an output voltage $V_{pp}$ having an erratic waveform pattern. That is, the piezoelectric device 140 periodically generates high electric energy whenever the vibrating body 120 collides with the stop area 220. In this case, the mass 180 vibrates with a frequency of 51.8 Hz with respect to a vertical direction of the base 260 and the vibrating body 120 has a thickness of 50 μm. The piezoelectric body 160 of the piezoelectric device 140 may comprise a PZT having a thickness of 127 μm. The impact-type piezoelectric micro power generator 100 may generate a continuous output voltage denser than general simple resonance-type piezoelectric micro power generators by using a vibration-induced impact.

Figure 4:
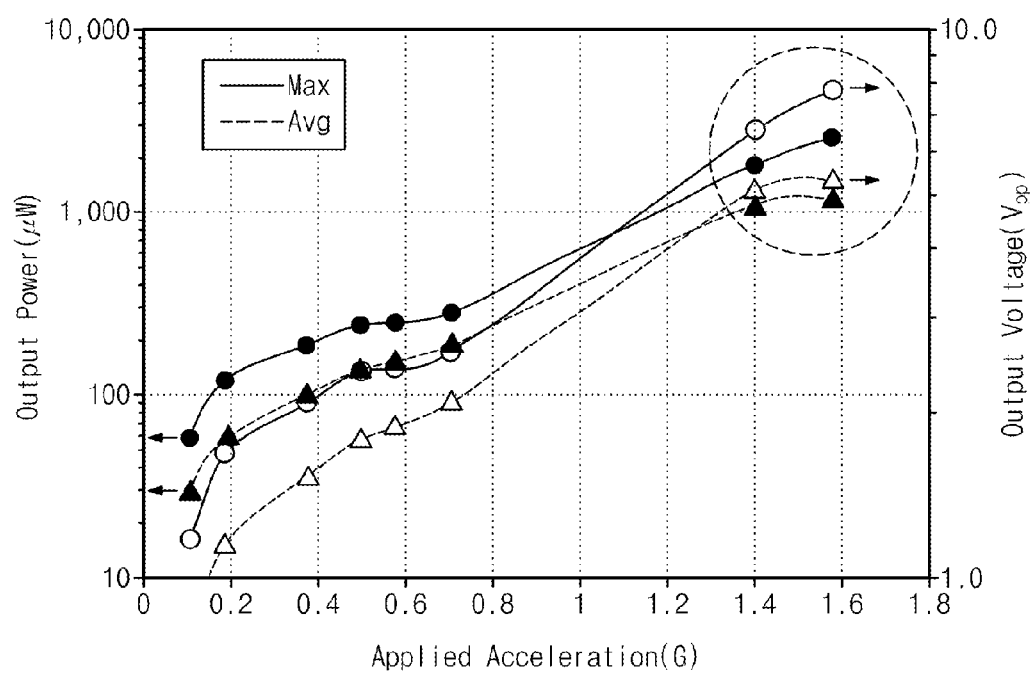
FIG. 4 is a graph illustrating output characteristics of electric energy at a resonance frequency when acceleration applying an external vibration in a Z-axis direction is changed in the impact-type piezoelectric micro power generator of FIGS. 1A and 1B, shown in generated output power and an output voltage.

FIG. 4 is a graph illustrating output characteristics of electric energy at a resonance frequency when acceleration applying an external vibration in a Z-axis direction is changed in the impact-type piezoelectric micro power generator 100, shown in generated output power and an output voltage.

The entire area of the impact-type piezoelectric micro power generator 100 used in the measurement may be about 20×20 mm, and the vibrating body 120 may have an area of about 13×12 mm and a thickness of about 50 μm. The piezoelectric body 160 may have an area of 37 mm$^2$, and the mass 180 may have a weight of 0.62 g. A lid (not shown) that is a cover covering the vibrating body 120 above the base 260 of the impact-type piezoelectric micro power generator 100 is manufactured and assembled thereto in such a way that a maximum moving distance of the vibrating body 120 is limited to ±1 mm. A load resistance connected outside is $R_L$=2.98 kΩ, and a resonance frequency is within a range from about 50.2 to 64 Hz. In this case, 1 G=9.8 m/s$^2$.

Referring to FIG. 4, electric power generated at the resonance frequency shows linearity in a logarithmic scale according to applied acceleration. Particularly, generated electric power shows maximum/average values=1.18/1.09 mW in an excitation condition of 1.4 G/62.3 Hz and 2.53/1.19 mW in a condition of 1.58 G/64 Hz, which are great values of about 1 mW or more. Accordingly, the impact-type piezoelectric micro power generator 100 may provide more electric power than a minimum value needed in general sensor modules in spite of a micro structure, thereby providing a margin in managing power sources.

Typically, general piezoelectric micro power generators have been applied to fields of being used in a harsh external environment such as TPMS systems. Accordingly, a mechanical shock in a harsh condition is artificially applied to the impact-type piezoelectric micro power generator 100, thereby estimating operation reliability thereof. A mechanical shock using a shock test system of Lansmont Corporation is applied with acceleration of 1,500 G for 0.5 ms in a Z-axis direction. The entire area of the impact-type piezoelectric micro power generator 100 that has been tested may be about 20×20 mm, and the vibrating body 120 may have an area of about 13×12 mm and a thickness of about 100 μm. The piezoelectric body 160 may have an area of 40 mm$^2$, and the mass 180 may have a weight of 0.62 g. A lid (not shown) that is a cover covering the vibrating body 120 above the base 260 of the impact-type piezoelectric micro power generator 100 is manufactured and assembled thereto in such a way that a maximum moving distance of the vibrating body 120 is limited to ±1 mm.

Figure 5:
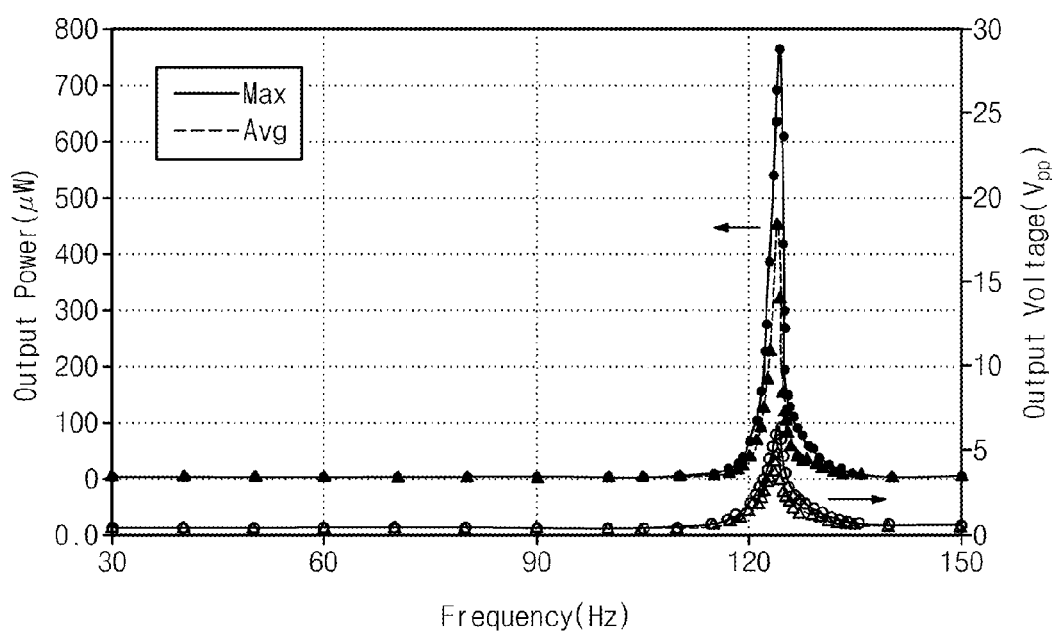
FIG. 5 is a graph illustrating a result of measuring characteristics of the impact-type piezoelectric micro power generator of FIGS. 1A and 1B after performing a shock test of 1,500 G/0.5 ms thereon.

FIG. 5 is a graph illustrating a result of measuring characteristics of the impact-type piezoelectric micro power generator 100 after performing a shock test of 1,500 G/0.5 ms on the impact-type piezoelectric micro power generator 100.

Referring to FIG. 5, when an external load resistance is $R_L=6.72$ kΩ, the impact-type piezoelectric micro power generator 100 may have a vibration response of resonance frequency of 124.3 Hz when acceleration applied in a Z-axis direction is 0.637 G. In this case, maximum/average values of generated electric power are 767/456 μW. Accordingly, the impact-type piezoelectric micro power generator 100 may normally generate a resonance frequency, an output voltage, and electric power after a harsh condition was applied.

The impact-type piezoelectric micro power generator 100 shows characteristics designed to respond to a low vibration frequency with a simple micro structure. Also, since high electric power can be generated in spite of the micro structure due to a vibration-induced impact, it is possible to satisfy an electric power level needed in general wireless sensor modules. Also, since electric energy can be normally generated after an external mechanical shock in a harsh condition, high reliability may be shown.

The impact-type piezoelectric micro power generator may comprise a base, a frame, a vibrating body, a piezoelectric device, and a mass. The base may comprise a cavity exposing the vibrating body downwardly and a stop area adjacent to the cavity. The frame may fasten the vibrating body to a circumstance of the cavity. The vibrating body may comprise a plurality of first vibrating beams extended from the frame toward a top of the cavity, an impact beam connected to between first tips of the plurality of first vibrating beams and extended onto the stop area, and a second vibrating beam extended from the impact beam to between the plurality of first vibrating beams having a second tip. The plurality of first vibrating beams, the impact beam, and the second vibrating beam may have a folded structure in the cavity. The piezoelectric device may be disposed on one of a top and a bottom of the second vibrating beam and the impact beam. The mass adjacent to the piezoelectric device may be fastened to the second tip that is a terminal of the second vibrating beam and may control a frequency response of the vibrating body. The piezoelectric device may generate high electric energy by using the vibrating body having the folded structure and colliding the vibrating body with the stop area.

Accordingly, the impact-type piezoelectric micro power generator, with the simple structure, may generate electric energy with high efficiency and provide high reliability.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An impact-type piezoelectric micro power generator comprising:
   a base having a cavity and at least one stop area adjacent to the cavity;
   a frame fastened to the base;
   a vibrating body comprising a plurality of first vibrating beams extended from the frame toward a top of the cavity, an impact beam connected to between first tips of the plurality of first vibrating beams and extended onto the stop area, and a second vibrating beam extended from the impact beam to between the plurality of first vibrating beams, the second vibrating beam having a second tip; and
   a piezoelectric device disposed on one of a top and a bottom of the second vibrating beam and the impact beam, the piezoelectric device generating electric power according to impacts of the vibrating body to the stop area and bending of the impact beam and the second vibrating beam.

2. The impact-type piezoelectric micro power generator of claim 1, wherein the frame has a shape of one of a loop and a ring surrounding the cavity of the base.

3. The impact-type piezoelectric micro power generator of claim 2, wherein the stop area of the base is disposed in the frame having the shape of one of the loop and the ring.

4. The impact-type piezoelectric micro power generator of claim 3, wherein the stop area is overlapped with both ends of the impact beam of the vibrating body and disposed below the impact beam.

5. The impact-type piezoelectric micro power generator of claim 3, wherein the stop area is disposed below one of the plurality of first vibrating beams and the impact beam.

6. The impact-type piezoelectric micro power generator of claim 3, wherein the stop area is disposed to traverse the cavity.

7. The impact-type piezoelectric micro power generator of claim 1, wherein the piezoelectric device is disposed on one of a top and a bottom of a part of the second vibrating beam and generates electric power according to bending of the second vibrating beam.

8. The impact-type piezoelectric micro power generator of claim 1, wherein the piezoelectric device is disposed on one of a top and a bottom of a part of the impact beam and generates electric power according to bending of the impact beam.

9. The impact-type piezoelectric micro power generator of claim 1, wherein the piezoelectric device comprises one of a piezoelectric unimorph, a piezoelectric bimorph, and a piezoelectric multimorph.

10. The impact-type piezoelectric micro power generator of claim 9, wherein the piezoelectric unimorph comprises:
    a lower electrode disposed on one of the second vibrating beam and the impact beam;
    a piezoelectric body disposed on the lower electrode; and
    an upper electrode disposed on the piezoelectric body.

11. The impact-type piezoelectric micro power generator of claim 10, wherein the piezoelectric body comprises at least one of an inorganic material, an organic material, and a mixture thereof.

12. The impact-type piezoelectric micro power generator of claim 10, further comprising:
    at least one wiring electrically connected to one of the upper electrode and the lower electrode of the piezoelectric device and the frame; and
    at least one pad electrically connected to the wiring and disposed on the base.

13. The impact-type piezoelectric micro power generator of claim 10, wherein the lower electrode is fastened to the vibrating body by using one of an adhesive and a deposited film.

14. The impact-type piezoelectric micro power generator of claim 13, wherein the adhesive comprises one of conductive epoxy and insulating epoxy.

15. The impact-type piezoelectric micro power generator of claim 1, further comprising a mass adjacent to the piezoelectric device and fastened to the second tip of the second vibrating beam to control a frequency response of the vibrating body.

16. The impact-type piezoelectric micro power generator of claim 1, further comprising a lid covering the vibrating body to restrict a moving distance of the vibrating body above the base or protect the vibrating body.

* * * * *